United States Patent
Marshall et al.

(10) Patent No.: US 6,819,123 B2
(45) Date of Patent: Nov. 16, 2004

(54) EXTRACTION OF INTERCONNECT PARASITICS

(75) Inventors: Andrew Marshall, Dallas, TX (US); Victor C. Sutcliffe, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/215,223

(22) Filed: Aug. 8, 2002

(65) Prior Publication Data

US 2003/0052700 A1 Mar. 20, 2003

Related U.S. Application Data

(60) Provisional application No. 60/323,074, filed on Sep. 19, 2001.

(51) Int. Cl.[7] .............................. G01R 27/08; H03B 1/00
(52) U.S. Cl. .................... 324/711; 324/76.54; 324/677; 331/57
(58) Field of Search .......................... 368/118; 324/73.1, 324/76.54, 763, 765, 158.1, 658, 677, 711, 442; 331/46, 49, 57, 74, 175

(56) References Cited

U.S. PATENT DOCUMENTS 6,005,829 A * 12/1999 Conn .......................... 368/118

* cited by examiner

*Primary Examiner*—Vincent Q. Nguyen
(74) *Attorney, Agent, or Firm*—W. James Brady, III; Frederick J. Telecky, Jr.

(57) ABSTRACT

The apparatus for detecting the effects of interconnect resistance and capacitance (RC) in a logic circuit includes a first ring oscillator with the interconnect RC parasitics in a logic circuit and a minimum reference ring oscillator without the interconnect RC parasitic in a logic circuit multiplexed to have common stages to obtain delay with and without the parasitics of the interconnect RC. The frequency difference between the first ring oscillator frequency and the minimum reference ring oscillator frequency is determined to detect the effects of the interconnect RC in the logic circuit.

7 Claims, 3 Drawing Sheets

EXTRACTION OF INTERCONNECT PARASITICS

This application claims priority under 35 USC 517 119(e)(1) of provisional application Ser. No. 60/323,074, filed Sep. 19, 2001.

FIELD OF INVENTION

This invention relates to improvements in the extraction of interconnect parasitics.

BACKGROUND OF INVENTION

Previously capacitance and resistance interconnect parasitics have been extracted from specific test structures. This is complex and time consuming. A direct capacitance extraction parametric tester can measure parallel plate and comb structure capacitance. Such a measurement tool capability and Device Under Test (DUT) area, limit accuracy and scribeline implementation. An alternative method that has been used is to load a ring oscillator with appropriate metalization, then to measure the frequency of the output. The ring oscillator capacitance extraction uses the ring oscillator frequency difference between a reference ring oscillator and one containing the resistance and capacitance (RC) network to calculate the capacitance. The ring oscillator frequency is the sum of the ring oscillator gate and the RC delays. This has various advantages, especially that of more reasonably simulating actual parasitic conditions in a circuit. However, the technique does not give a good overall value of just the parasitics.

The method used previously has two independent ring oscillators, one with minimal loading, and the other with significant parasitic loading. From this it is possible to obtain two delay times, and to calculate the delay attributable to the parasitics. This can cause some problems, since ring oscillators from a wafer lot can, under normal temperature and voltage conditions, display output frequencies that can range over +/−30% from normal. Adjacent rings would be unlikely to exhibit such large variation, but a 10% difference is not uncommon. Since the delay time of the parasitics is rarely greater than the delay of the ring, any delay in the ring causes a similar error in the parasitic values. An example of this type of circuit is shown in FIGS. 1 and 2. FIG. 1 illustrates a conventional layout of four ring oscillators 11–14. Sharing certain common bondpads this requires 12 bondpads 40 (four output pads, four voltage supply, two shared ground pads, and two divider supply pads) for four rings. Each ring has an associated divider. FIG. 2(a) illustrates a minimum interconnect ring of 11 inverter 20–30 oscillator, with frequency divider 31. FIG. 2(b) illustrates the same structure but with additional interconnect 33. The additional interconnect has parasitic capacitance and resistance that slows down the ring frequency.

SUMMARY OF INVENTION

In accordance with one embodiment of the present invention an improved detectability of the effects of interconnect RC in a logic circuit is provided by multiplexing parasitic and minimum oscillator circuitry to obtain delay with and without parasitics.

DESCRIPTION OF PREFERRED EMBODIMENT OF THE PRESENT INVENTION

In accordance with the present invention a means is provided for selectively switching a basic ring oscillator, or one of several paths. In accordance with a preferred embodiment a multiplexer is integrated into the ring oscillator circuit. The ring allows many of the ring components to be common to each resistance and capacitance (RC) measurement (ring oscillator frequency). The component sharing reduces the key source of uncontrolled variation in the ring oscillator frequency. The ring oscillator to ring oscillator base frequency speed varies by 10–30% of the nominal frequency for adjacent and far separated rings.

Figure 1:
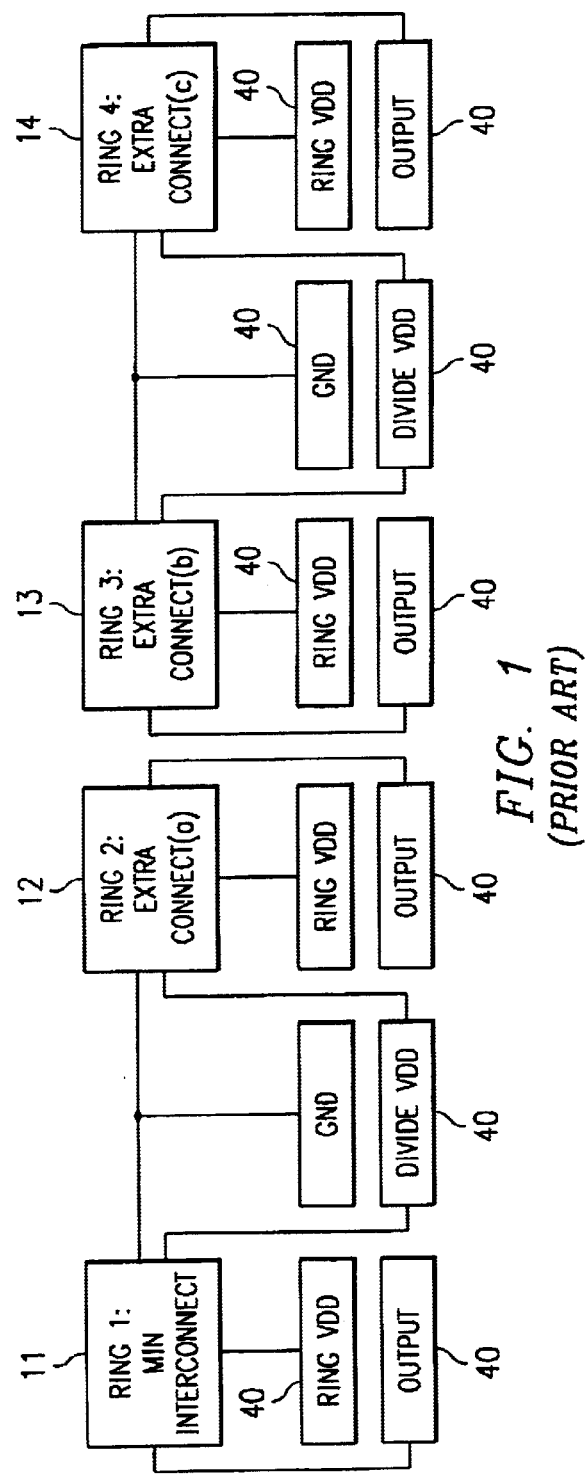
FIG. 1 illustrates a conventional layout of four ring oscillators.
Figure 2B:
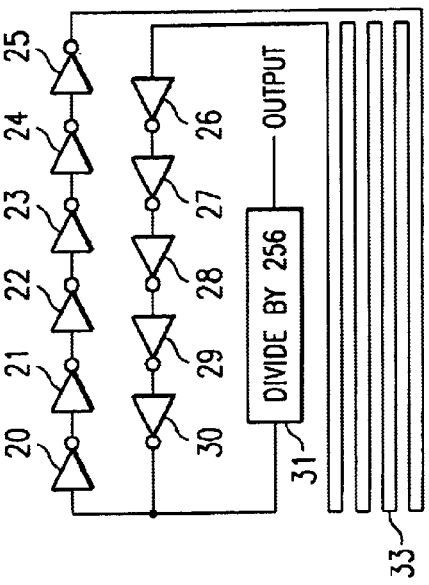
FIG. 2(b) illustrates the same structure as FIG. 2(a), but with additional interconnect.
Figure 2A:
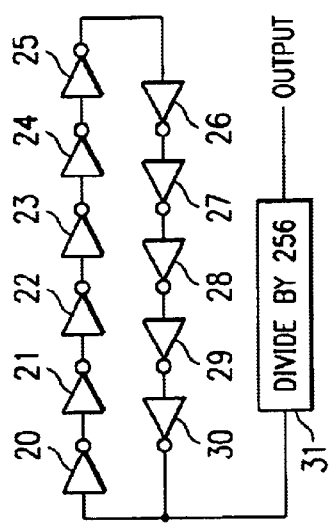
FIG. 2(a) illustrates a minimum interconnect ring of 11 inverter oscillator with divider.
Figure 3:
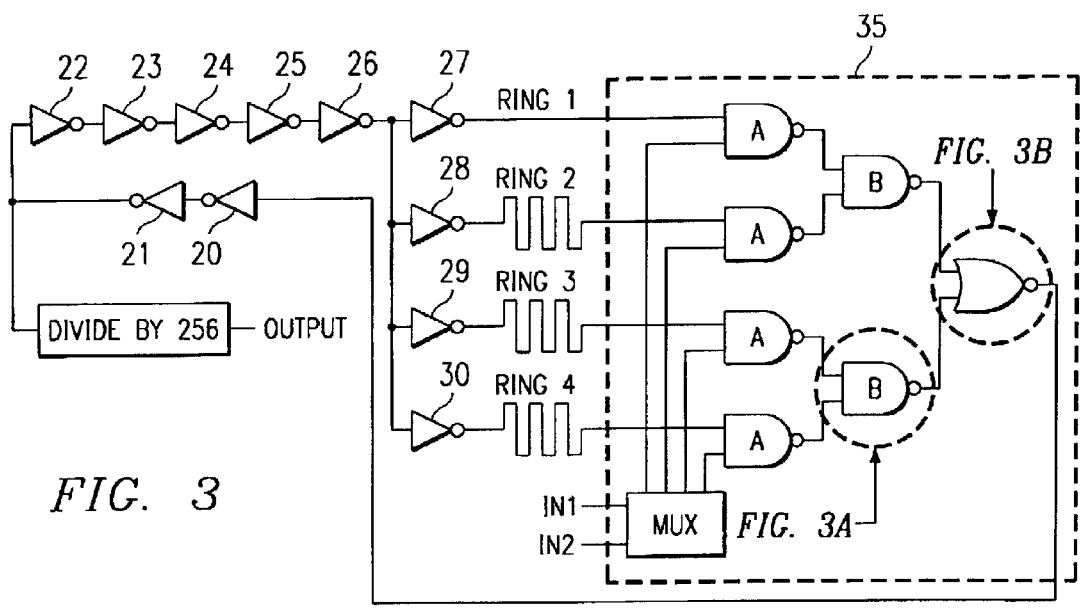
FIG. 3 illustrates an implementation of a multiplexed ring oscillator according to one embodiment of the present invention.
Figure 3A:
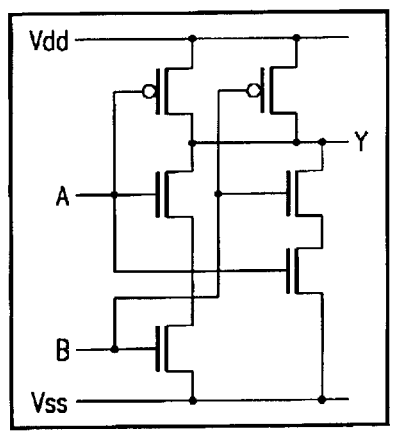
Figure 3B:
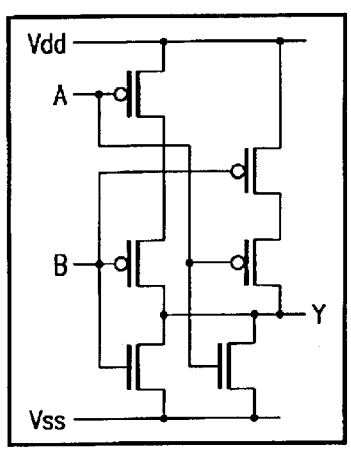
Figure 4:
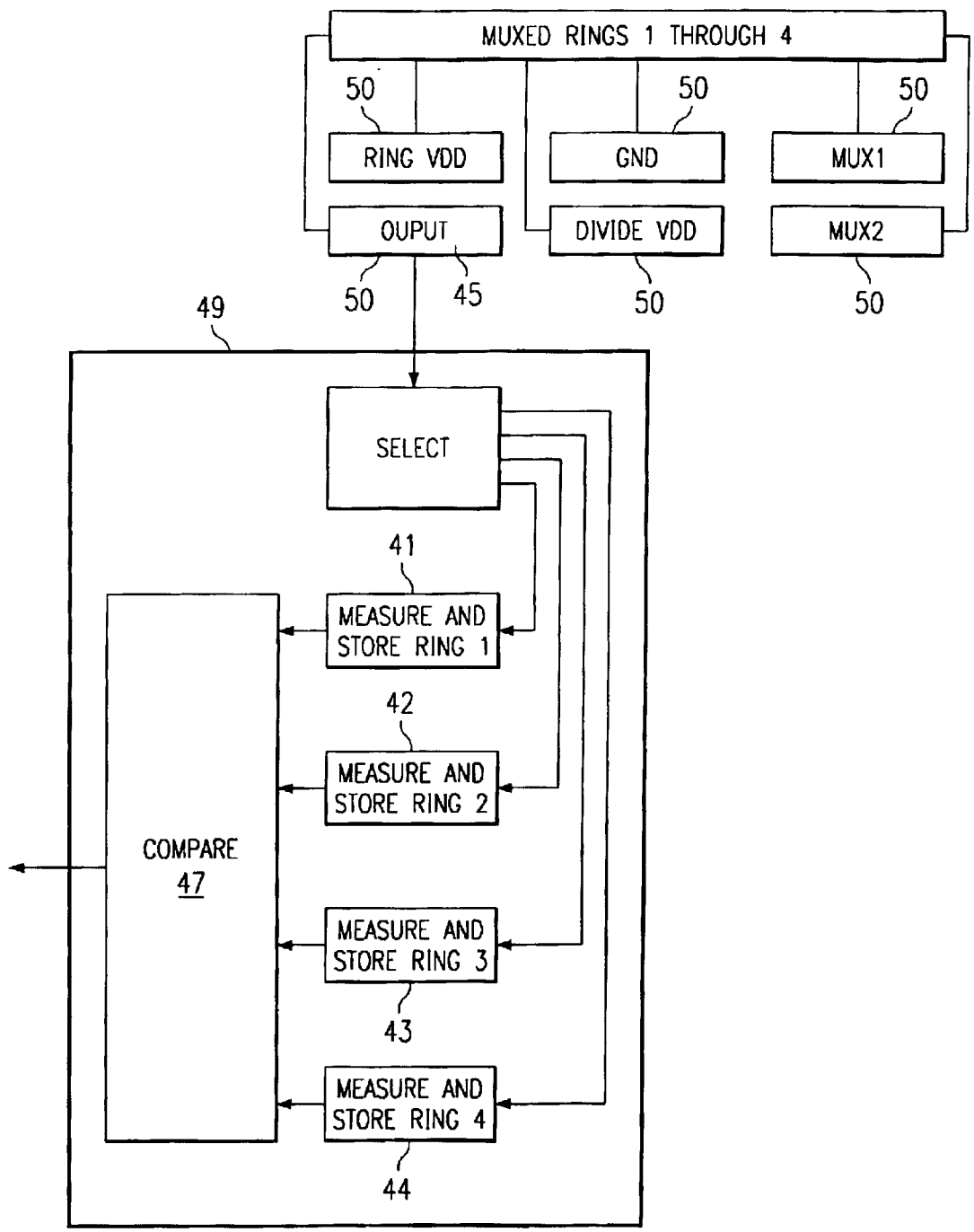
FIG. 4 illustrates a configuration for multiplexed ring loading according to one embodiment of the present invention.

With a ring of 11 inverter oscillator, for a four-way selectable ring there are seven common stages, and a further four that are adjacent, that make up the drivers or the decode. FIGS. 3 and 4 show the preferred implementation. FIG. 3 illustrates the seven common inverter stages 20–26 and the four parallel (common input and non-common output) inverter stages 27–30 that make up the drivers or the decode. FIG. 3 also illustrates a balanced multiplex 35 used for optimum matching of the remaining stages. The bits IN1 and IN2 control which ring oscillator is selected via the gates. The output frequencies for the separated ring oscillators (Ring 1–Ring 4) are measured and stored at 41–44 as taken from the output contact 45 in FIG. 4 are compared at comparator 47 to determine the interconnect capacitance. The part of the implementation taken from the output of output contact 45 represented by reference 49 is performed by a software tester routine. The advantages, in addition to the improvement in accuracy of the measurements, are that fewer bondpads are required for the testing. See FIG. 4 for the configuration for multiplexed ring loading. In the example there are six (6) bond pads 50 required for the four options versus twelve (12) for the prior art. There is also a significant chip area reduction. The chip area is approximately $\frac{1}{3}^{rd}$ of that required by the prior art. This is important, as the parasitic extraction modules are often included in the scribeline, where area is a premium.

Clearly it is possible to multiplex many more than four (4), but a tradeoff occurs, in that as more stages are multiplexed fewer stages are common. However, further multiplexing comes at a very high advantage in terms of probe/bond pads required, such that eight (8) different options only requires seven (7) pads, just one more pin than the four (4) options take.

While the invention has been described in the context of a preferred embodiment, it will be apparent to those skilled in the art that the present invention may be modified in numerous ways and may assume many embodiments other than that specifically set out and described above.

What is claimed is:

1. An apparatus for detecting the effects of interconnect resistance and capacitance (RC) in a logic circuit comprising:

a first oscillator with the interconnect RC parasitics in a logic circuit and a minimum reference oscillator without the interconnect RC parasitics in a logic circuit multiplexed to have common circuitry to obtain delay with and without the parasitics of the interconnect RC and means for determining the frequency difference between the first oscillator with the interconnect RC in a logic circuit and said minimum reference oscillator frequency to determine the interconnect capacity in the logic circuit.

2. The apparatus of claim 1 wherein said first oscillator includes inverting circuitry with delay and said minimum reference oscillator includes inverting circuitry and delay and said common circuitry includes some of said inverting circuitry.

3. The apparatus of claim 2 wherein said first oscillator is a ring oscillator and said minimum reference oscillator is a ring oscillator.

4. The apparatus of claim 3 wherein said inverting circuitry includes multiple inverter stages.

5. The apparatus of claim 4 wherein said common circuitry includes multiple inverter stages.

6. The apparatus of claim 5 wherein said uncommon circuitry includes a separate inverter stage.

7. The apparatus of claim 1 wherein said means for determining frequency difference includes means for measuring the frequency of each oscillator and means for comparing the frequency difference.

* * * * *